Figure 2:
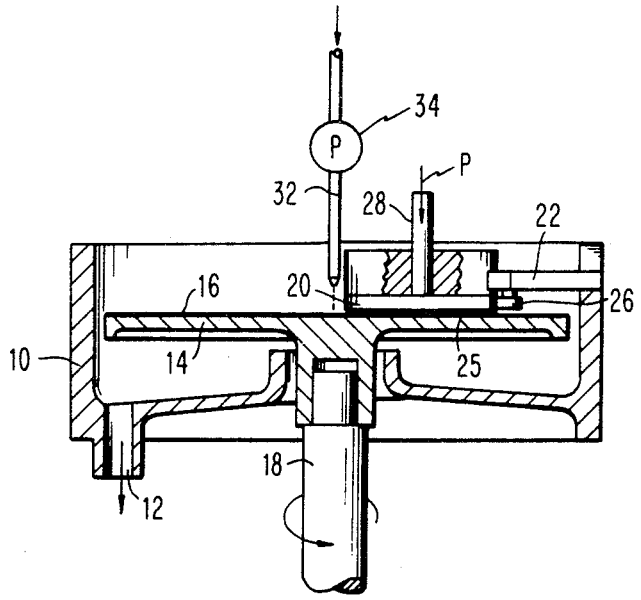
Figure 1:
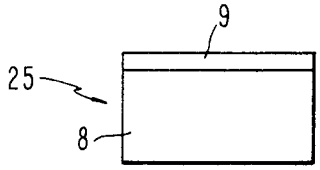
Figure 3:
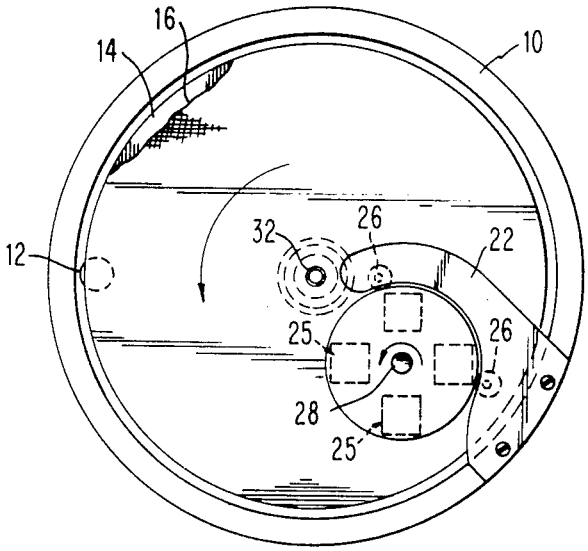

United States Defensive Publication [19] (H) [11] T105,402

Basi et al. [43] May 7, 1985

[54] METHOD FOR POLISHING AMORPHOUS ALUMINUM OXIDE

[76] Inventors: Jagtar S. Basi, 97 Nantucket Dr., Fishkill, N.Y. 12524; Eric Mendel, 3 High Point Dr., Poughkeepsie, N.Y. 12603

[21] Appl. No.: 603,263

[22] Filed: Apr. 23, 1984

Related U.S. Application Data

[63] Continuation of Ser. No. 474,120, Apr. 10, 1983, abandoned.

[51] Int. Cl.[3] ..... H01L 21/306

[52] U.S. Cl. ..... 156/636; 156/667; 252/79.1

[57] ABSTRACT

A method for the chemical-mechanical polishing of amorphous aluminum oxide surfaces to a high degree of perfection is described. The aluminum oxide surfaces are continuously wetted with a water-citric acid slurry containing a soft abrasive material. The continuously wiping of the aluminum oxide surface is accomplished with a firm surface using pressure while maintaining a relative movement between the aluminum oxide surface and the firm surface to remove the water reacted aluminum oxide product from the high points of the aluminum oxide surface. This method is continued until a high degree of perfection of the surface is accomplished. The slurry is typically composed of colloidal silicon dioxide dispersed in water containing citric acid.

10 Claims, 1 Sheet Drawing,

14 Pages Specification

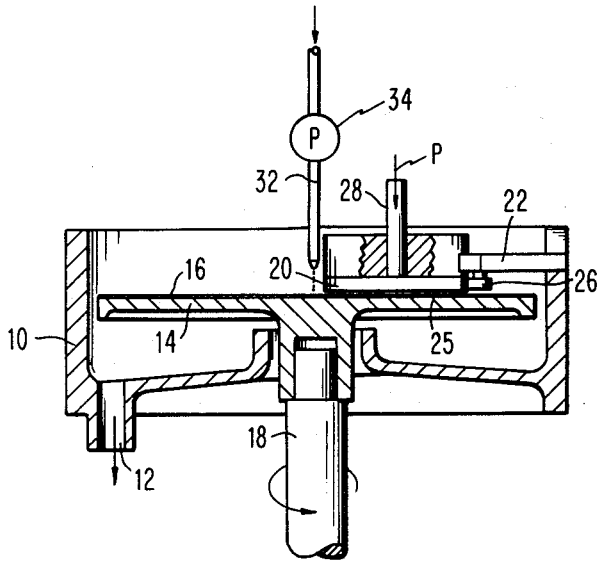

The file of this unexamined application may be inspected and copies thereof may be purchased (849 O.G. 1221, Apr. 9, 1968).